(12) United States Patent
Bao et al.

(10) Patent No.: US 12,550,727 B2
(45) Date of Patent: Feb. 10, 2026

(54) ELASTIC HEAT SPREADER FOR CHIP PACKAGE, PACKAGE STRUCTURE AND PACKAGING METHOD

(71) Applicant: STATS ChipPac Semiconductor (Jiangyin) Co., LTD., Wuxi (CN)

(72) Inventors: Man Bao, Wuxi (CN); Weijun Wang, Wuxi (CN)

(73) Assignee: STATS CHIPPAC SEMICONDUCTOR (JIANGYIN) CO., LTD., Wuxi (CN)

( * ) Notice: Subject to any disclaimer, the term of this patent is extended or adjusted under 35 U.S.C. 154(b) by 393 days.

(21) Appl. No.: 18/209,470

(22) Filed: Jun. 13, 2023

(65) Prior Publication Data

US 2023/0411235 A1 Dec. 21, 2023

(30) Foreign Application Priority Data

Jun. 21, 2022 (CN) .......................... 202210704484.2

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4871* (2013.01); *H01L 23/49822* (2013.01);
(Continued)

(58) Field of Classification Search
CPC ........... H01L 23/3675; H01L 23/49822; H01L 23/49894; H01L 21/4871; H01L 24/13; H01L 24/16; H01L 24/29; H01L 24/32; H01L 24/33; H01L 24/73; H01L 24/81; H01L 25/16; H01L 2224/13147; H01L 2224/13155; H01L 2224/16227; H01L 2224/29166; H01L 2224/32245; H01L 2224/33051; H01L 2224/73204;
(Continued)

(56) References Cited

U.S. PATENT DOCUMENTS

| 2005/0112796 A1* | 5/2005 | Ararao ................ H01L 23/3672 438/106 |
| 2006/0001156 A1* | 1/2006 | Wakiyama ............ H01L 25/105 257/E23.101 |
| 2021/0235596 A1* | 7/2021 | Uppal ..................... H01L 23/42 |

FOREIGN PATENT DOCUMENTS

CN 109786336 A 5/2019

* cited by examiner

*Primary Examiner* — Peniel M Gumedzoe
(74) *Attorney, Agent, or Firm* — MUNCY, GEISSLER, OLDS & LOWE, P.C.

(57) ABSTRACT

The present invention discloses an elastic heat spreader for chip packaging, a packaging structure and a packaging method. The heat spreader includes a top cover plate and a side cover plate that extends outward along an edge of the top cover plate, wherein the top cover plate is configured to be placed on a chip, and at least a partial region of the side cover plate is an elastic member; and the elastic member at least enables the side cover plate to be telescopic in a direction perpendicular to the top cover plate. According to the present invention, a following problem is solved: delamination between the heat spreader and a substrate as well as the chip due to stress generated by different thermal expansion coefficients of the substrate, the heat spreader and the chip in a packaging process of a large-size product.

18 Claims, 7 Drawing Sheets

(51) Int. Cl.
*H01L 23/00* (2006.01)
*H01L 23/498* (2006.01)
*H01L 25/16* (2023.01)

(52) U.S. Cl.
CPC ........ *H01L 23/49894* (2013.01); *H01L 24/13* (2013.01); *H01L 24/16* (2013.01); *H01L 24/29* (2013.01); *H01L 24/32* (2013.01); *H01L 24/33* (2013.01); *H01L 24/73* (2013.01); *H01L 24/81* (2013.01); *H01L 25/16* (2013.01); *H01L 2224/13147* (2013.01); *H01L 2224/13155* (2013.01); *H01L 2224/16227* (2013.01); *H01L 2224/29166* (2013.01); *H01L 2224/32245* (2013.01); *H01L 2224/33051* (2013.01); *H01L 2224/73204* (2013.01); *H01L 2224/73253* (2013.01); *H01L 2224/81203* (2013.01); *H01L 2924/1616* (2013.01); *H01L 2924/16235* (2013.01); *H01L 2924/16251* (2013.01); *H01L 2924/165* (2013.01)

(58) Field of Classification Search
CPC . H01L 2224/73253; H01L 2224/81203; H01L 2924/1616; H01L 2924/16235; H01L 2924/16251; H01L 2924/165
See application file for complete search history.

ELASTIC HEAT SPREADER FOR CHIP PACKAGE, PACKAGE STRUCTURE AND PACKAGING METHOD

TECHNICAL FIELD

The present invention relates to the field of semiconductor packaging technologies, and more particularly to an elastic heat spreader for chip packaging, a packaging structure and a packaging method.

BACKGROUND

A flip chip ball grid array (FCBGA) is a semiconductor package with a chip disposed at one side end of a substrate and a spherical grid array disposed at the other side end of the substrate. The spherical grid array allows the FCBGA to be installed on a printed circuit board. Heat generated during chip operation needs to be dissipated to a fluid medium such as air to ensure that the FCBGA operates normally.

At present, the commonly used packaging structure includes a fixed heat spreader, which is disposed above the substrate, and generally connected to the back of a chip through a thermal interface material (TIM) heat-radiating adhesive, such that the heat generated during chip operation is dissipated into the outside air. However, the size of a heat spreader matched with an FCBGA packaging product increases along with the size increase of the FCBGA packaging product. Due to different thermal expansion coefficients of the heat spreader and the substrate, as the size increases, the warpage of the product becomes larger, and the stress between the corresponding heat spreader and the substrate increases, resulting in a risk of delamination between the heat spreader and the substrate as well as the chip. As a result, the heat dissipation performance of the chip packaging structure is reduced.

SUMMARY

An object of the present invention is to provide an elastic heat spreader for chip packaging, a packaging structure and a packaging method.

To fulfill one of the objects of the present invention, an elastic heat spreader for chip packaging is provided according to an embodiment of the present invention. The elastic heat spreader includes a top cover plate and a side cover plate that extends outward along an edge of the top cover plate, wherein the top cover plate is configured to be placed on a chip; and at least a partial region of the side cover plate is an elastic member; and the elastic member at least enables the side cover plate to be telescopic in a direction perpendicular to the top cover plate.

As a further improvement of an embodiment of the present invention, the elastic member is inclined or perpendicular to the top cover plate.

As a further improvement of an embodiment of the present invention, the elastic member is of a foldable structure.

As a further improvement of an embodiment of the present invention, the elastic member is surrounded by a flexible filling adhesive.

As a further improvement of an embodiment of the present invention, a partial region of the top cover plate is of a grid structure.

As a further improvement of an embodiment of the present invention, the grid structure includes a baffle layer disposed horizontally and a plurality of grid pieces perpendicularly disposed on upper and lower surfaces of the baffle layer; two ends of each grid piece do not exceed the top cover plate region; the baffle layer and the grid pieces divide the partial region of the top cover plate into a plurality of grid grooves; and each grid groove is filled with a heat-conducting metal material which covers the grid pieces.

As a further improvement of an embodiment of the present invention, an area of the top cover plate having the grid structure is the same as an area of the chip.

As a further improvement of an embodiment of the present invention, the heat spreader further includes a supporting portion, which is disposed at one end of the side cover plate distal from the top cover plate.

The present invention provides a packaging structure. The packaging structure includes a chip carrier, a chip and the elastic heat spreader for chip packaging according to any one of the embodiments, wherein the chip is flip-welded above the chip carrier, the heat spreader is disposed on the chip carrier and forms a cavity with the chip carrier, and the chip is disposed in the cavity; and the top cover plate is disposed on an upper surface of the chip, and the side cover plate connects the top cover plate and the chip carrier.

As a further improvement of an embodiment of the present invention, the grid structure is disposed directly above the chip.

As a further improvement of an embodiment of the present invention, a metal layer is further disposed between the top cover plate and the chip.

As a further improvement of an embodiment of the present invention, the chip carrier is a substrate, and the chip is welded to the substrate through a metal solder ball and electrically connected to the substrate.

As a further improvement of an embodiment of the present invention, the chip carrier is a redistribution layer which includes a plurality of dielectric layers and metal layers disposed in the dielectric layers; a photolithography pattern opening is formed in an upper surface of each dielectric layer, extends to the corresponding metal layer and exposes an surface of the metal layer; a metal electrode is disposed at the photolithography pattern opening; and the chip is welded to the metal electrodes through metal posts/metal bumps, and is electrically connected to the redistribution layer.

As a further improvement of an embodiment of the present invention, the dielectric layer is a resin material having a photolithography characteristic, and the metal layer is of a single-layer or multi-layer metal structure.

The present invention further provides a packaging method. The packaging method includes the following steps:

providing a chip carrier;

providing a chip, wherein a functional surface of the chip is flip-mounted on the chip carrier, and electrically connected to the chip carrier; and providing a heat spreader, wherein the heat spreader is disposed on the chip carrier and forms a cavity with the chip carrier; the chip is disposed in the cavity; the heat spreader is the elastic heat spreader for chip packaging according to any one of the above embodiments; the top cover plate is disposed on the upper surface of the chip; and the side cover plate connects the top cover plate and the chip carrier.

As a further improvement of an embodiment of the present invention, the method, prior to providing the heat spreader, further includes:

forming a metal layer on the upper surface of the chip.

As a further improvement of an embodiment of the present invention, the step of providing the chip carrier and the step of providing the chip, the functional surface of the chip being flip-mounted on the chip carrier and electrically connected to the chip carrier, specifically include the following steps:

providing a substrate; and welding the functional surface of the chip to the substrate through a metal solder ball so as to be electrically connected to the substrate.

As a further improvement of an embodiment of the present invention, the step of providing the chip carrier and the step of providing the chip, the functional surface of the chip being flip-mounted on the chip carrier and electrically connected to the chip carrier, specifically include the following steps:

providing a redistribution layer which includes a plurality of dielectric layers and metal layers disposed in the dielectric layers;

forming a photolithography pattern opening in an upper surface of each dielectric layer, extending the photolithography pattern opening to the corresponding metal layer and exposing a surface of the metal layer, and disposing a metal electrode at the photolithography pattern opening; and welding the functional surface of the chip to the metal electrodes on the surface of the redistribution layer through metal posts/metal bumps.

As a further improvement of an embodiment of the present invention, the dielectric layer is a resin material having a photolithography characteristic, and the metal layer is of a single-layer or multi-layer metal structure.

The beneficial effects of the present invention are as follows. The following problem is solved: the delamination between the heat spreader and the substrate as well as the chip due to the stress generated by different thermal expansion coefficients of the substrate, the heat spreader and the chip in the packaging process of large-size products. The partial region of the side cover plate of the heat spreader is configured as the elastic member, such that the risk of delamination between the heat spreader and the substrate as well as the chip resulting from the deformation caused by stress relief in a high-temperature environment is reduced, thereby improving the heat dissipation performance of a large-size product packaging structure.

DETAILED DESCRIPTION

In order to make the objects, technical solutions, and advantages of the present application clearer, the technical solutions of the present application will be clearly and completely described below in conjunction with the specific embodiments of the present application and the corresponding drawings. Obviously, the described embodiments are only a part of the embodiments of the present application, rather than all of the embodiments. Based on the embodiments in the present application, all other embodiments obtained by those of ordinary skill in the art without creative work shall fall within the protection scope of this application.

The following describes the embodiments of the present invention in detail. Examples of the embodiments are shown in the accompanying drawings, in which the same or similar reference numerals indicate the same or similar elements or elements with the same or similar functions throughout the Description. The following embodiments described with reference to the accompanying drawings are exemplary, and are only used to explain the present invention, but should not be understood as limiting the same.

The terms representing spatial relative positions, such as "upper", "lower", "rear", and "front" as used herein describe the relationship of a unit or feature relative to another unit or feature in the accompanying drawings for the purpose of illustration. The terms of the spatial relative positions may include different orientations of a device in use or operation except the orientations shown in the drawings. For example, if the device in the drawings is turned over, the units described as "below" or "above" other units or features will be "above or "below" other units or features. Thus, the exemplary term "below" can encompass two orientations of "below" and "above".

Figure 1:
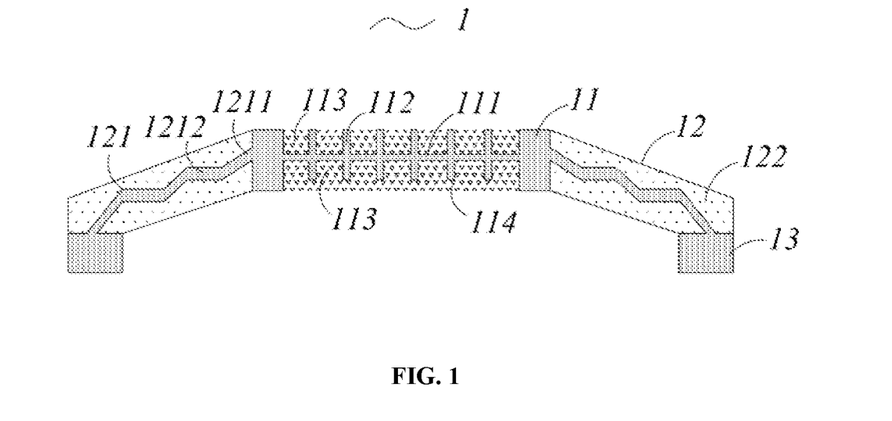
FIG. 1 is a schematic structural diagram of an elastic heat spreader for chip packaging in an embodiment of the present invention.

As shown in FIG. 1, an elastic heat spreader 1 for chip packaging is provided according to this embodiment, and includes a top cover plate 11 and a side cover plate 12.

Preferably, the top cover plate 11 and the side cover plate 12 are made of an aluminum silicon carbide composite material with low density, a high thermal conductivity and a low expansion coefficient. Of course, in some other embodiments, the top cover plate 1 and the side cover plate 12 may also be made of other highly heat-conducting materials, e.g., metal materials such as aluminum and copper, or highly heat-conducting carbon materials such as diamond and graphene.

The top cover plate 11 is placed on the chip to receive heat transferred during the operation of the chip, and dissipate the heat into a surrounding air medium.

The side cover plate 12 extends outward along the edge of the top cover plate 11. Further, at least a partial region of the side cover plate 12 is an elastic member 121, which at least enables the side cover plate 12 to be telescopic in a direction perpendicular to the top cover plate 11. A material for manufacturing the elastic member 121 is the same as a material for manufacturing the side cover plate 12, both of which have the same heat-conducting property.

Specifically, the elastic member 121 is inclined to the top cover plate 11, which can both allow the side cover plate 12 to be telescopic in a direction perpendicular to the top cover plate 11, and allow the side cover plate 12 to be telescopic in a direction parallel to the top cover plate 11. In a specific embodiment of the present invention, an included angle between the elastic member 121 as a whole and the top cover plate 11 is an obtuse angle, such that the entire chip packaging structure is more stable after the heat spreader 1 is installed in the chip packaging structure.

Of course, the magnitude of the included angle between the elastic member 121 as a whole and the top cover plate 11 is not limited to the obtuse angle. In other embodiments of the present invention, the included angle between the elastic member 121 as a whole and the top cover plate 11 may also be a right angle, so as to achieve the purpose of at least enabling the side cover plate 12 to be telescopic in the direction perpendicular to the top cover plate 11. Alternatively, the included angle between the elastic member 121 as a whole and the top cover plate 11 may also be an acute angle, such that the side cover plate 12 can be telescopic not only in the direction perpendicular to the top cover plate 11, but also in a direction parallel to the top cover plate 11.

More specifically, the entire portion of the side cover plate 12 is an elastic member 121, which further increases the overall elastic performance of the heat spreader 1.

The elastic member 121 is specifically of a foldable structure, including an upper foldable surface 1211 and a lower foldable surface 1212. When the elastic member 121 performs the telescopic movement in the direction perpendicular to the top cover plate 11, or performs the telescopic movement in the direction parallel to the top cover plate 11, or simultaneously performs the telescopic movement in both directions, and the elastic member 121 is in a fully stretched state, the upper foldable surface 1211 and the lower foldable surface 1212 are in the same plane. The length of the elastic member 121 may be specifically designed according to actual situations of its applications to different chip packaging structures.

In other embodiments of the present invention, the elastic member 121 may also be designed as a wavy structure, or other elastic stretchable structures that can be made based on a material of the elastic member 121.

Further, the elastic member 121 is surrounded by a flexible filling adhesive 122. The flexible filling adhesive 122 is preferably a low-modulus filling adhesive. The low-modulus filling adhesive has the characteristics such as high sealing performance and high elongation and can buffer the stress of the elastic member 121 generated by the warpage of the chip packaging structure, and also make the side cover plate 12, such that the entire structure of the heat spreader 1 is more stable. In other embodiments of the present invention, other organic silica gel substances with high elongation may also be selected as the flexible filling adhesive 122.

Furthermore, a partial portion of the top cover plate 11 is of a grid structure, which includes a baffle layer 111 disposed horizontally and a plurality of grid pieces 112 perpendicularly disposed on the upper surface and the lower surface of the baffle layer 111. In the specific embodiments of the present invention, the grid pieces 112 disposed on the upper surface of the baffle layer 111 are in one-to-one correspondence to the grid pieces 112 disposed on the lower surface of the baffle layer 111, and the baffle layer 111 and the grid pieces 112 are made of the same material as the top cover plate 11 and integrally-formed with the top cover plate 11.

In other embodiments of the present invention, the grid pieces 112 disposed on the upper surface of the baffle layer 111 and the grid pieces 112 disposed on the lower surface of the baffle layer 111 may also be staggered, which will not be limited in the present invention.

Specifically, both ends of each grid piece do not extend the top cover plate region. That is, the bottom end of the grid piece 112 disposed on the lower surface of the baffle layer 111 is higher than the lower surface of the top cover plate 11 in a vertical direction, to prevent the grid pieces 112 from protruding out of the lower surface of the top cover plate 11, thereby avoiding the risk of crushing the chip when the heat spreader 1 is packaged above the chip. The baffle layer 111 and the grid pieces 112 divide a partial region of the top cover plate 11 into a plurality of grid grooves 113. The grid grooves 113 are filled with a heat-conducting metal material 114. The heat-conducting metal material 114 specifically covers all the grid pieces 112. The upper surface of the heat-conducting metal material 114 filled in the upper surface of the baffle layer 111 does not exceed the upper surface of the top cover plate 11, and the lower surface of the heat-conducting metal material 114 filled in the lower surface of the baffle layer 111 does not exceed the lower surface of the top cover plate 11.

In specific embodiments of the present invention, the heat-conducting metal material 114 is a highly heat-conducting metal material, and specifically can be metal indium, or metal silver or indium-silver alloy materials. In some other embodiments of the present invention, the heat-conducting metal material 114 may also be other metal materials or metal alloys with high thermal conductivities and low melting points.

It should be noted that, if the number of the divided grid grooves 113 is too large, the region of the grid grooves 113 will be too small, and their corners will not often be filled with the heat-conducting metal material 114, resulting in a problem that the interior of the grid groove 113 cannot be completely filled with the heat-conducting metal material 114. If the number of the divided grid grooves 113 is too small, the grid grooves 113 cannot function to fix the heat-conducting metal material 114, and similarly, too short grid pieces 112 may also not function to fix the heat-conducting metal material 114. In different embodiments of the present invention, the specific number of grid grooves 113 in the grid structure and the specific lengths of the grid pieces 112 may be set according to specific characteristics of materials for producing the top cover plate 11 and the heat-conducting metal material 114 in practice.

More specifically, the area of the region of the top cover plate 1l having the grid structure may be designed according to the sizes of the chips in different packaging structures. In specific embodiments of the present invention, the area of the region of the top cover plate 11 having the grid structure is the same as the area of the chip in which it is applied to the packaging structure.

The lower surface of the heat-conducting metal material 114 corresponds exactly to the upper surface of the chip. The heat spreader 1 is disposed above the chip to complete the packaging, so as to ensure that the upper surface of the chip is in complete contact with the heat-conducting metal material 114.

In this embodiment, the partial region of the top cover plate 11 is configured as a grid structure in which the heat-conducting metal material 114 is sufficiently filled, and is then packaged with the surface of the chip through a volatile solvent. In the actual packaging structure, a metal layer also needs to be formed on the upper surface of the chip. The heat-conducting metal material 114 and the metal layer are welded together through the volatile solvent, and the heat-conducting metal material 114 is in complete contact with the surface of the metal layer, instead of a structure in the prior art in which the heat spreader 1 and the chip are packaged through a heat-radiating adhesive, thereby improving the heat dissipation of the chip packaging.

Further, the heat spreader 1 further includes a supporting portion 13, which is disposed at one end of the side cover plate 12 distal from the top cover plate 11, such that the stability of the heat spreader 1 applied to the packaging structure is further increased. Specifically, the supporting portion 13 is of a cuboid structure, the plane of which is parallel to the top cover plate 11. In other embodiments of the present invention, the supporting portion 13 may also be a prism structure, a semi-circle structure or other graphical structure capable of supporting the heat spreader 1 to be fixed to the chip packaging structure.

Preferably, the supporting portion 13 is also made of an aluminum silicon carbide composite material with low density, a high thermal conductivity and a low expansion coefficient.

Of course, in some other embodiments, the supporting portion 13 may also be made of other highly heat-conducting materials, e.g., metal materials such as aluminum and copper, or highly heat-conducting carbon materials such as diamond and graphene.

The present invention provides a packaging structure. The packaging structure includes a chip carrier, a chip and the elastic heat spreader for chip packaging described in any one of the above embodiments. The chip is flip-welded above the chip carrier, the heat spreader is disposed on the chip carrier and forms a cavity with the chip carrier, and the chip is disposed in the cavity. The top cover plate is disposed on the upper surface of the chip, and the side cover plate connects the top cover plate and the chip carrier. The elastic heat spreader provided by the present invention can be applied to a variety of chip packaging structures. Two specific embodiments are provided below to specifically describe the chip packaging structure having the elastic heat spreader in some embodiments of the present invention.

Embodiment 1

Figure 2:
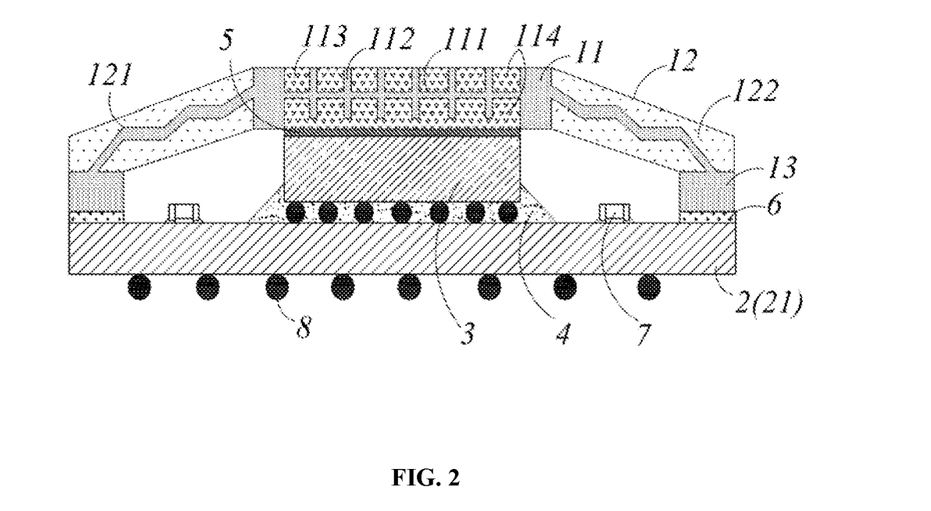
FIG. 2 is a schematic diagram of a packaging structure in Embodiment 1 of the present invention.

As shown in FIG. 2, Embodiment 1 of the present invention provides a packaging structure. The packaging structure includes a chip carrier 2, a chip 3 and the elastic heat spreader 1 for chip packaging described in any of the above embodiments.

Specifically, the chip carrier 2 is a substrate 21, which has an upper surface and a lower surface disposed away from the upper surface. A plurality of electrical pads is disposed on the upper surface of the substrate 21.

The chip 3 is flip-welded to the upper surface of the substrate 21, and electrically connected to the substrate 21. Specifically, the chip 3 has a functional surface and a non-functional surface opposite to the functional surface. The functional surface of the chip 3 is arranged to face the substrate, and electrically connected to the electrical pads on the upper surface of the substrate 21 through metal solder balls. At a welding region between the chip 3 and the substrate 21, that is, the surrounding portion of the metal solder balls is filled with an underfill adhesive 4, to prevent a crack problem at the welding positions between the chip 3 and the substrate 21 caused by the thermal stress or mechanical impact, thereby enhancing the bonding force between the chip 3 and the substrate 21.

The heat spreader 1 is disposed on the substrate 21, and forms a cavity with the substrate 21. The chip 3 is disposed in the cavity. Specifically, the top cover plate 11 is disposed on the upper surface of the chip 3, and the side cover plate 12 connects the top cover plate 11 and the substrate 21.

In this embodiment, the area of the portion of the top cover plate 11 having the grid structure is the same as that of the chip 3. The grid structure is arranged directly above the chip 3.

Specifically, the grid structure is filled with a heat-conducting metal material 114. The heat-conducting metal material 114 covers all grid pieces 112. The lower surface of the heat-conducting metal material 114 filled in the lower surface of the baffle layer 111 does not exceed the lower surface of the top cover plate 11, and is in complete contact with the upper surface of the chip 3 to improve the heat dissipation efficiency.

Further, a metal layer 5 is further disposed between the top cover plate 11 and the chip 3. The upper surface of the metal layer 5 is in full contact with the lower surface of the heat-conducting metal material 114 filled in the lower surface of the baffle layer 111, instead of a structure of the prior art in which the heat spreader 1 and the chip are packaged by a heat-conducting adhesive, thereby improving the heat dissipation of the chip packaging.

The metal layer 5 may be made of TiNiAu, or TiNiAg, or AlTiNiVAu, or AlTiWAu, and formed on the upper surface of the chip 3. The heat generated by the operation of the chip 3 can be quickly transferred into the heat spreader 1 through the metal layer 5, and then transferred from the heat spreader 1 to the surrounding air medium, forming a chip packaging structure with high heat-radiating performance.

In specific embodiments of the present invention, the entire region of the side cover plate 12 is configured as an elastic member 121, specifically a foldable structure, which is the same as the foldable structure described above, and will not be repeated here. The elastic member 121 is surrounded by a flexible filling adhesive 122, specifically a low-modulus filling adhesive, which can buffer a stress of the elastic member 121 caused by the warpage generated among the chip 3, the substrate 21 and the heat spreader 1 of the packaging structure, and make the side cover plate 12 more stable.

Further, the heat spreader 1 further includes a supporting portion 13, which is disposed at one end of the side cover plate 12 away from the top cover plate 11. The heat spreader 1 is disposed above the substrate 21 through the supporting portion 13 to form a cavity with the substrate 21.

Specifically, the supporting portion 13 is fixed by an adhesive layer 6 on the upper surface of the substrate 21. The main ingredients of the adhesive layer 6 are organic silicon resin and a filler (silica/silver/aluminum, etc.), which increase the bonding force between the heat spreader 1 and the substrate 21. Of course, in other embodiments of the present invention, other high-temperature resistant organic silica gel materials may also be selected as the adhesive layer 6, as long as the heat spreader 1 and the substrate 21 can be fixed.

Of course, in a specific embodiment of the present invention, at least one electronic component 7 is also welded on the upper surface of the substrate 21, and a solder ball body 8 is formed on the lower surface of the substrate 21. An electrical connection can be formed among the chip 3, the substrate 21 and an external circuit board through the solder ball body 8.

Furthermore, in the structure of this embodiment, the chip carrier 2 may also be a redistribution layer. The specific structure of the redistribution layer is not specifically described in this embodiment. Similarly, the chip 3 is flip-welded on the redistribution layer. The heat spreader 1 is adhered with the redistribution layer through the supporting portion 13 and fixedly disposed above the redistribution layer. The heat spreader 1 forms a cavity with the redistribution layer, and the chip 3 is disposed inside the cavity.

Embodiment 2

Figure 3:
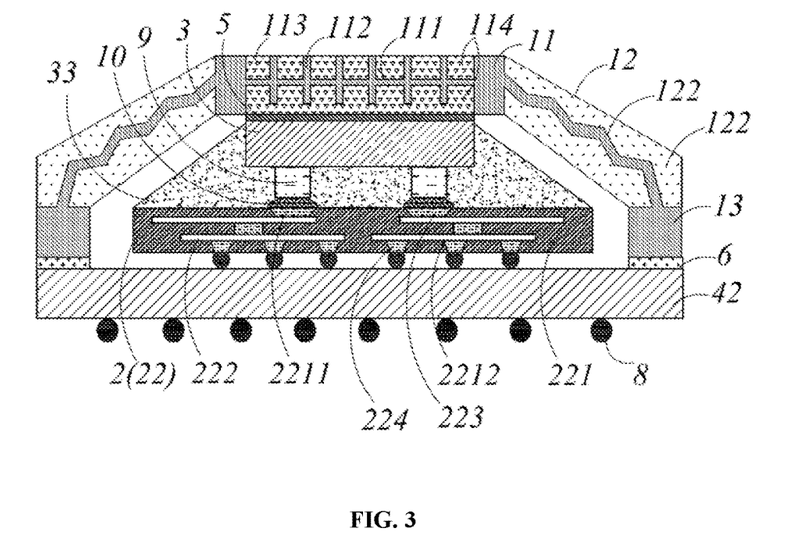
FIG. 3 is a schematic diagram of a packaging structure in Embodiment 2 of the present invention.

As shown in FIG. 3, Embodiment 2 of the present invention provides a packaging structure. The chip carrier 2 is specifically a redistribution layer 22, which includes a plurality of dielectric layers 221 and a metal layer 222 disposed therein.

Specifically, a photolithography pattern opening 2211 is formed in the upper surface of the redistribution layer 22, i.e., the upper surface of each dielectric layer 221. The photolithography pattern opening 221 extends to the upper surface of the corresponding metal layer 222 and exposes the upper surface of the metal layer 222. A metal electrode 223 is disposed at the photolithography pattern opening 2211. The specific shape of the photolithography pattern opening 2211 is not limited in the present invention.

The dielectric layer 221 is a resin material with a photolithography characteristic, such as polyimide (PI), or benzocyclobutene (BCB). The metal layer 222 and the metal electrode 223 may be of a single-layer metal structure or a multi-layer metal structure, and may be specifically made of metal copper, nickel or titanium/copper, titanium tungsten/nickel, etc.

Of course, in some other embodiments of the present invention, the redistribution layer 22 may be specifically a high-density redistribution layer, which is formed by superimposing a plurality of dielectric layers 221 and the metal layers 222. The number and specific distribution methods of the high-density redistribution layers can be designed according to actual chip packaging requirements.

The chip 3 is flip-welded on the redistribution layer 22 and then electrically connected to the redistribution layer 22. Specifically, the chip 3 has a functional surface and a non-functional surface opposite to the functional surface. The functional surface of the chip 3 is disposed to face the redistribution layer 22, and is provided with metal posts/metal bumps 9. Each metal post/metal bump 9 is welded on the corresponding metal electrode 223 through a solder 10. Here, the metal post/metal bump 9 is made of a conductive metal material such as copper and nickel, and the solder 10 is made of a pure tin or tin-based solder alloy.

Further, the packaging structure in this embodiment further includes a plastic packaging layer 33. The plastic packaging layer 33 is filled at the connection between the chip 3 and the redistribution layer 22. The top of the plastic packaging layer 33 is not higher than the upper surface of the chip 3 in a height direction of the chip 3. Here, the plastic packaging layer 33 is preferably made of an epoxy plastic packaging material.

Furthermore, a plurality of further photolithography pattern openings 2212 is formed in the lower surface of the corresponding dielectric layer 221. The further photolithography pattern openings 2212 extend to the lower surface of the corresponding metal layer 222 in the dielectric layer 221 and expose the lower surface of the metal layer 222. A metal electrode 224 which is welded with an external circuit is disposed at the further photolithography pattern opening 2212. Similarly, the specific shapes and sizes of the further photolithography pattern openings 2212 are not limited in the present invention.

Differing from the structure in Embodiment 1, the packaging structure in this embodiment further includes an externally-connected substrate 42, wherein the redistribution layer 22 is electrically connected to the externally-connected substrate 42 by a solder ball body formed on the metal electrode 224 that is welded with the external circuit; a solder ball body 8 is then formed on the lower surface of the externally-connected substrate 42; and an electric connection may be formed among the chip 3, the redistribution layer 22, the externally-connected substrate 42 and the external circuit board by means of the solder ball body 8.

Further, in other embodiments of the present invention, the plastic packaging layer 33 may also extend to the upper surface of the externally-connected substrate 42 to cover the redistribution layer 22, thereby enhancing the bonding force between the redistribution layer 22 and the externally-connected substrate 42.

The heat spreader 1 is disposed on the externally-connected substrate 42, and forms a cavity with the externally-connected substrate 42. The redistribution layer 22 and the chip 3 are disposed in the cavity. Specifically, the upper surface of the chip 3 is further provided with a metal layer 5, the top cover plate 11 is disposed on the upper surface of the metal layer 5, and the side cover plate 12 connects the top cover plate 11 and the externally-connected substrate 42.

The specific structure of the heat spreader 1 packaged on the chip 3 in this embodiment is the same as the heat spreader 1 in Embodiment 1, and will not be repeated herein. Similarly, the supporting portion 13 of the heat spreader 1 in this embodiment is fixed by an adhesive layer 6 on the upper surface of the externally-connected substrate 42.

Figure 4:
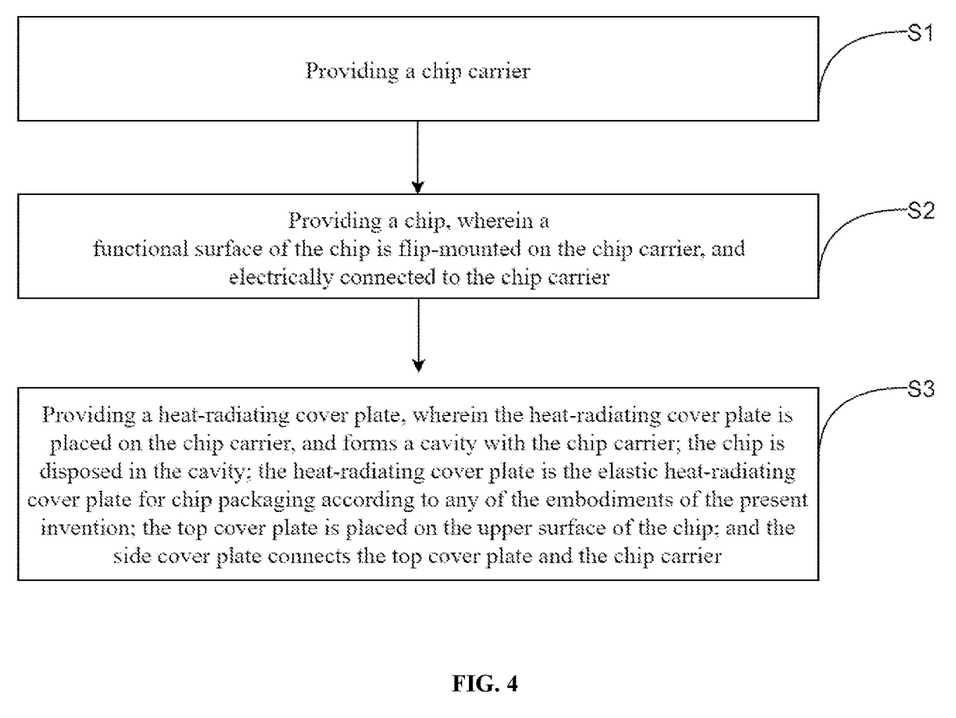
FIG. 4 is a schematic flowchart of a packaging method in an embodiment of the present invention.

As shown in FIG. 4, a packaging method provided by this embodiment includes the following steps.

In S1, a chip carrier 2 is provided.

In S2, a chip 3 is provided, wherein a functional surface of the chip 3 is flip-mounted on the chip carrier 2, and electrically connected to the chip carrier 2.

Figure 5A:
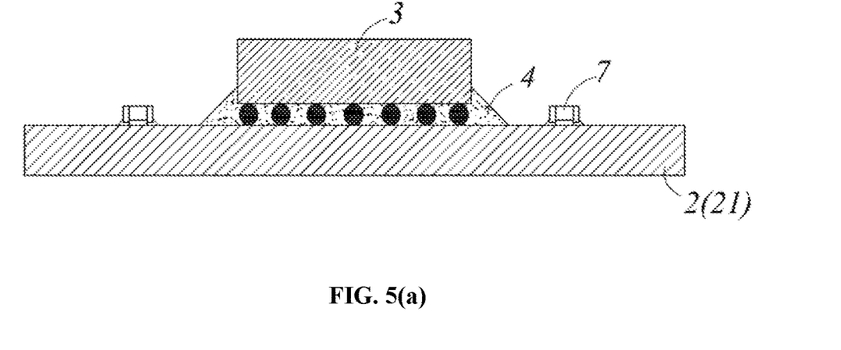
FIGS. 5(a) to 5(d) are schematic diagrams of steps of a manufacturing process of the packaging structure in Embodiment 1 of the present invention.

FIGS. 5(a) to 5(d) are diagrams of steps of a manufacturing process of the structure in Embodiment 1 of the present invention. The chip carrier 2 in Embodiment 1 is specifically a substrate 21. The upper surface of the substrate 21 is provided with a plurality of electrical pads. The functional surface of the chip 3 is welded to the upper surface of the substrate 21 through a metal solder ball using a flip ball bonding process, and electrically connected to the substrate 21, where a welding position is filled with an underfill adhesive 4, as shown in FIG. 5(a).

Prior to S2, the method further includes: mounting at least one electronic component 7 onto the upper surface of the substrate 21. Of course, the mounting of the electronic component 7 may also be performed after the step of welding the chip 3.

In S3, a heat spreader 1 is provided, wherein the heat spreader 1 is disposed on the chip carrier 2 and forms a cavity with the chip carrier 2; the chip 3 is disposed in the cavity; the heat spreader 1 is the elastic heat spreader for a chip packaging structure according to any one of the above embodiments; the top cover plate 11 is disposed on the upper surface of the chip 3; and the side cover plate 12 connects the top cover plate 11 and the chip carrier 2.

Figure 5B:
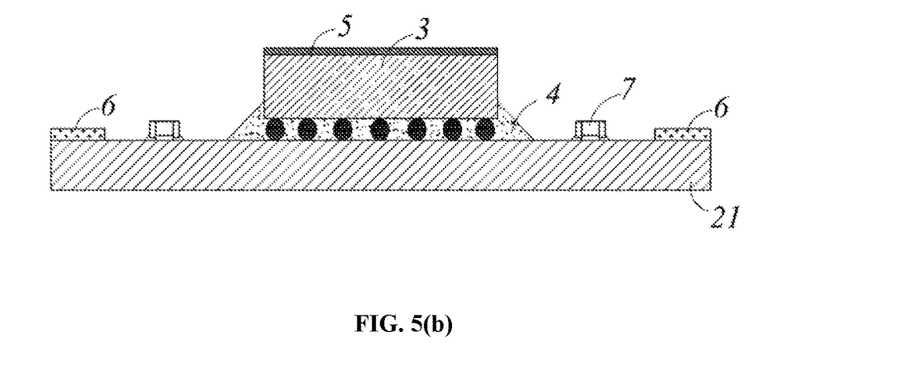
Figure 5C:
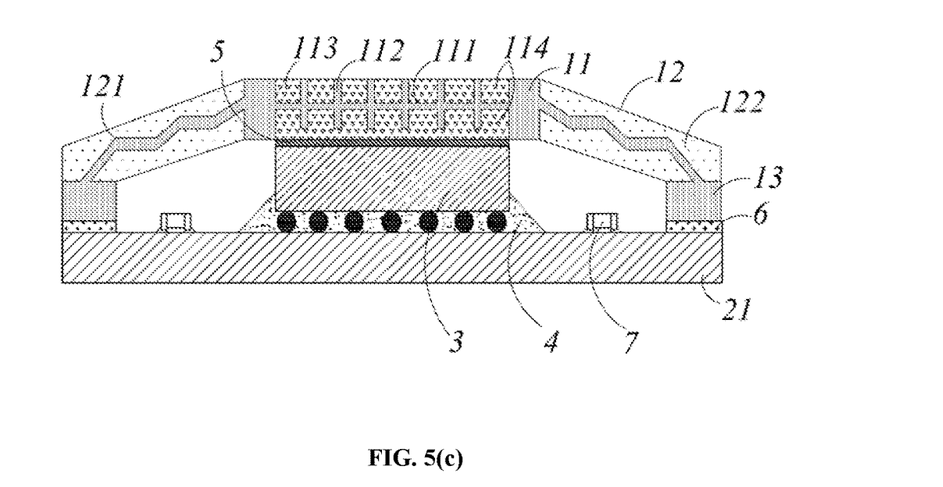

Corresponding to the structure in Embodiment 1, prior to S3, the method further includes: forming a metal layer 5 on the upper surface of the chip 3, and coating a region on the upper surface of the substrate 2, which is to be in contact with the heat spreader 1, with an adhesive layer 6, as shown in FIG. 5(b). The heat spreader 1 is placed on the substrate 21. As shown in FIG. 5(c), specifically, the supporting portion 13 of the heat-radiating substrate is fixed above the substrate 21 through the adhesive layer 6, and the top cover plate 11 is placed on the upper surface of the metal layer 5.

Specifically, prior to packaging the heat spreader 1, the method further includes a process of: spraying a layer of soldering flux on the upper surface of the metal layer 5, such that the top cover plate 11 and the metal layer 5 are fixedly welded together. Here, the soldering flux is a volatile solvent that will volatilize during a subsequent high-temperature furnace reflow soldering process of the packaging structure.

More specifically, the region of the top cover plate 11 filled with the heat-radiating metal material 114 is partially placed directly above the metal layer 5. After the subsequent reflux process, the soldering flux sprayed on the upper surface of the metal layer 5 volatilizes, and the heat-conducting metal material 114 is welded with the metal layer 5 in a eutectic manner. The heat generated by the chip 3 can be quickly transferred to the heat spreader 1 through the metal layer 5, and then transferred to the surrounding air medium for heat dissipation.

Figure 5D:
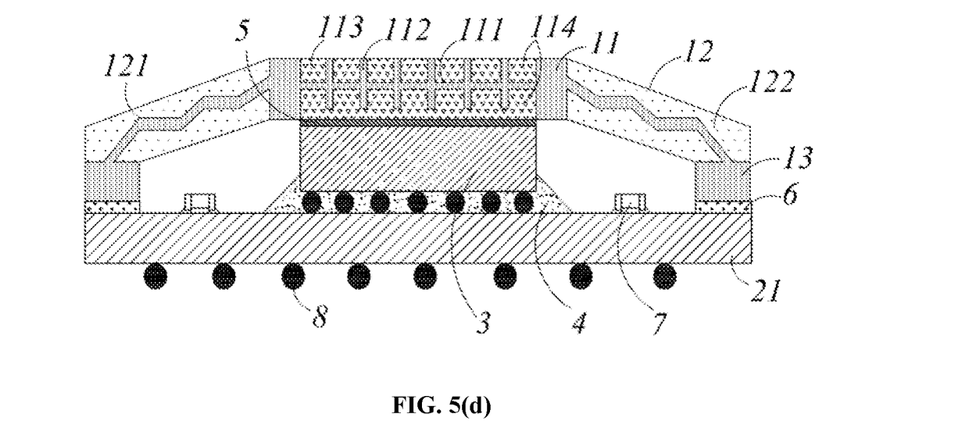

Of course, after S3, the method further includes curing, reflow soldering and other process steps. And, as shown in FIG. 5(*d*), the chip 3 and the substrate 21 are electrically connected to an externally-connected circuit board by welding ball bodies 8 on the lower surface of the substrate 21.

Furthermore, in the manufacturing method of the structure in this embodiment, providing the chip carrier 2 may also refer to providing a redistribution layer. The specific structure of the redistribution layer is not specifically described herein. Similarly, the chip 3 is flip-welded on the redistribution layer. The heat spreader 1 is adhered with the redistribution layer through the supporting portion 13 and fixedly disposed above the redistribution layer. The heat spreader 1 forms a cavity with the redistribution layer, and the chip 3 is disposed inside the cavity.

FIG. 6(*a*) to 6(*f*) are diagrams of steps of a manufacturing process of the packaging structure in Embodiment 2 of the present invention. Differing from the manufacturing steps of the packaging structure in Embodiment 1, S1 and S2 specifically include: providing a redistribution layer 22 which includes a plurality of dielectric layers 221 and metal layers 222 disposed in the dielectric layers 221.

Specifically, as shown in FIG. 6(*a*), a photolithography pattern opening 2211 is formed in the upper surface of each dielectric layer 221. The photolithography pattern opening 2211 extends to the upper surface of the corresponding metal layer 222 and exposes the upper surface of the metal layer 222. A metal electrode 223 is disposed at the photolithography pattern opening 2211.

Figure 6A:
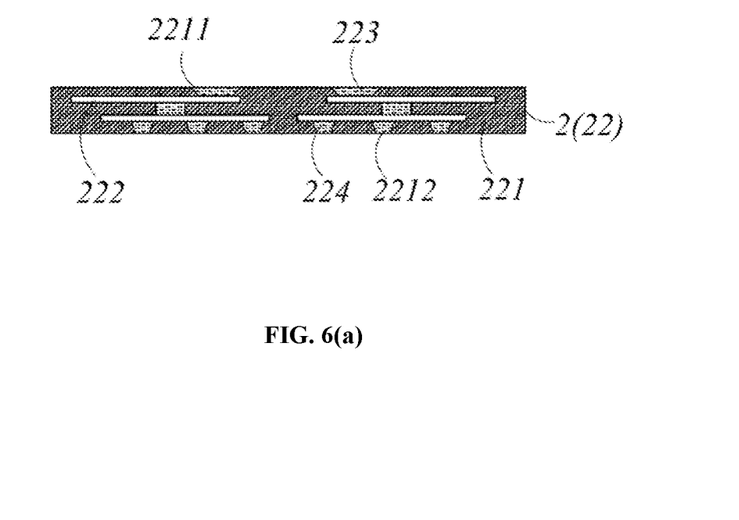
FIG. 6(a) to 6(f) are schematic diagrams of steps of a manufacturing process of the packaging structure in Embodiment 2 of the present invention.

The dielectric layer 221 is a resin material with a photolithography characteristic, such as polyimide (PI), or benzocyclobutene (BCB). The metal layer 222 and the metal electrode 223 may be of a single-layer metal structure or a multi-layer metal structure, and may be specifically made of metal copper, nickel or titanium/copper, titanium tungsten/nickel, etc.

Of course, in some other embodiments of the present invention, the redistribution layer 22 may be specifically a high-density redistribution layer, which is formed by superimposing a plurality of dielectric layers 221 and a metal layer 222. The number and specific distribution methods of the high-density redistribution layers may be designed according to actual chip packaging requirements.

A further photolithography pattern opening 2212 is further formed in the lower surface of each dielectric layer 221. The further photolithography pattern opening 2212 extends to the lower surface of the corresponding metal layer 222 and exposes the lower surface of the metal layer 222.

A metal electrode 224 which is welded with an externally-connected circuit is formed at the further photolithography pattern opening 2212. The specific manufacturing method of the redistribution layer 22 refers to the prior art, which will not be repeated here.

Figure 6B:
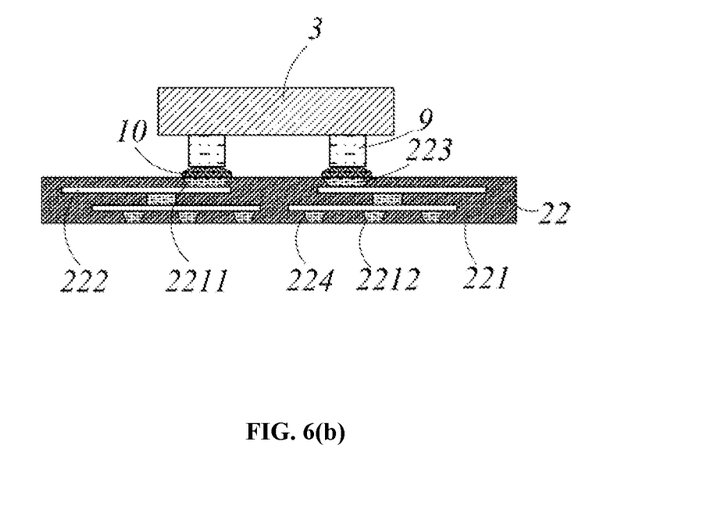

The functional surface of the chip 3 is welded to the metal electrodes 223 through metal posts/metal bumps 9 and the solders 10. Here, the metal post/metal bump 9 is made of a conductive metal material such as copper and nickel, and the solder 10 is made of a pure tin or tin-based solder alloy, as shown in FIG. 6(*b*).

Figure 6C:
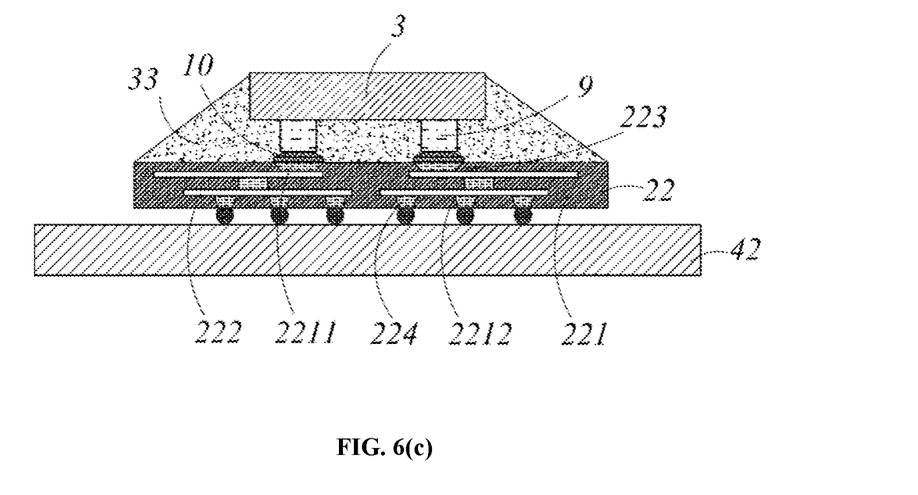
Figure 6D:
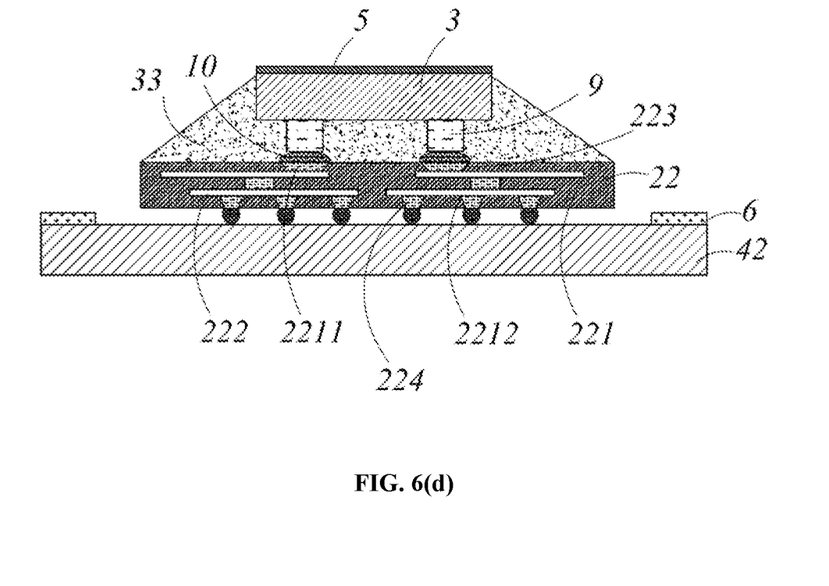

A plastic packaging layer 33 is filled between the redistribution layer 22 and the chip 3. The top end of the plastic packaging layer 33 is not higher than the upper surface of the chip 3. An externally-connected substrate 42 is provided. The redistribution layer 22 is welded to the upper surface of the externally-connected substrate 42 by welding ball bodies at the metal electrodes 224 on the lower surface of the redistribution layer 22, that is welded with the externally-connected circuit, thereby achieving the electric connection between the redistribution layer 22 and the externally-connected substrate 42, as shown in FIG. 6(*c*). Of course, in other embodiments of the present invention, it is also possible to weld the redistribution layer 22 to the externally-connected substrate 42 first, and then fill the plastic packaging layer 33 between the chip 3 and the redistribution layer 22. The plastic packaging layer 33 may also extend to the upper surface of the externally-connected substrate 42.

Similarly, a metal layer 5 is formed on the upper surface of the chip 3, and a region on the upper surface of the externally-connected substrate 42, which is to be in contact with the heat spreader 1, is coated with an adhesive layer 6, as shown in FIG. 6(*d*). Prior to packaging the heat spreader 1, the method further includes a process of: spraying a layer of soldering flux on the upper surface of the metal layer 5, such that the top cover plate 11 and the metal layer 5 are fixedly welded together. Here, the soldering flux is a volatile solvent that will volatilize during the subsequent high-temperature furnace reflow soldering process of the packaging structure.

Figure 6E:
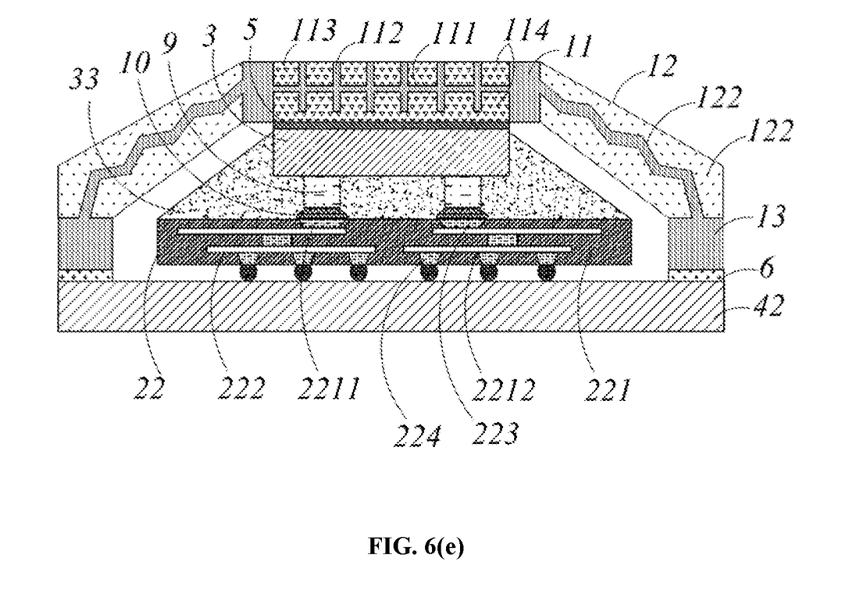

The heat spreader 1 is placed above the redistribution layer. As shown in FIG. 6(*e*), the supporting portion 13 of the heat spreader is fixed above the externally-connected substrate 42 through the adhesive layer 6, and the top cover plate 11 is placed on the upper surface of the metal layer 5. Similarly, the region of the top cover plate 11 filled with the heat-radiating metal material 114 is partially placed directly above the metal layer 5. After the subsequent reflux process, the soldering flux sprayed on the upper surface of the metal layer 5 volatilizes, and the heat-conducting metal material 114 is welded with the metal layer 5 in a eutectic manner. The heat generated by the chip 3 can be quickly transferred to the heat spreader 1 through the metal layer 5, and then transferred to the surrounding air medium for heat dissipation.

Figure 6F:
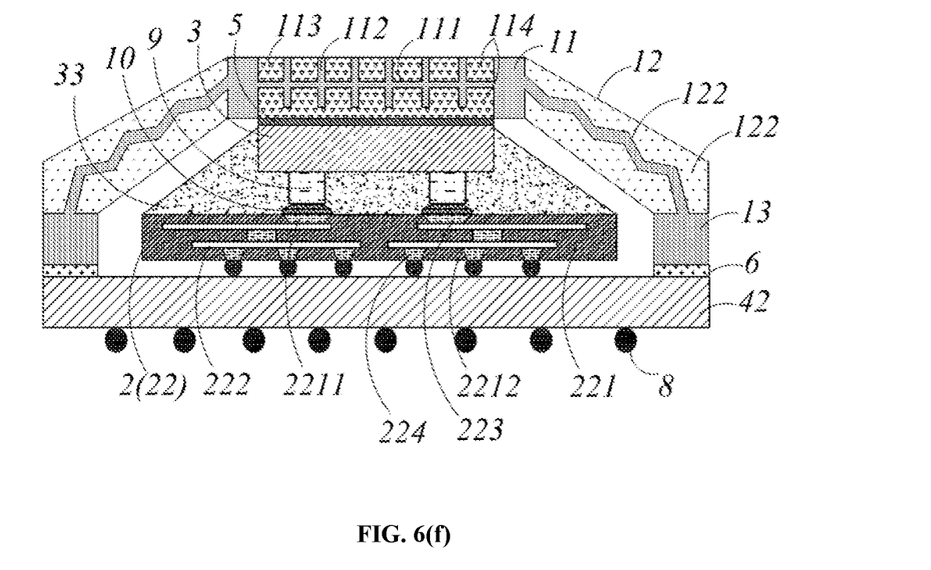

Similarly, after S3, the method further includes curing, reflow soldering and other process steps. And, ball bodies 8 are welded at the lower surface of the externally-connected substrate 42, such that as shown in FIG. 6(*f*), the chip 3, the redistribution layer 22 and the externally-connected substrate 42 are electrically connected to the externally-connected circuit board.

In summary, the following problem is solved: the delamination between the heat spreader and the substrate as well as the chip due to the stress generated by different thermal expansion coefficients of the substrate, the heat spreader and the chip in the packaging process of large-size products. A partial region of the side cover plate of the heat spreader is configured as the elastic member, such that the risk of delamination between the heat spreader and the substrate as well as the chip resulting from the deformation caused by stress relief in a high-temperature environment is reduced. In addition, a metal layer is plated onto the back surface of the chip, and a portion of the heat spreader that is in contact with the chip for heat dissipation is designed as a grid structure. The grid structure is filled with a highly heat-conducting metal material, such that the metal layer is in full contact with the highly heat-conducting metal material, which can quickly transfer the heat generated by the chip to the surrounding air medium, instead of a structure in the prior art in which the heat spreader and the chip are packaged through a heat-radiating adhesive. Therefore, a large-size and highly heat-radiating chip packaging structure is implemented.

It is to be understood that although the present invention is described in terms of embodiments in this Description, each of the embodiments is not intended to contain an independent technical solution. Such description manner of the Description is merely intended for clarity, and those skilled in the art should regard the description as a whole. The technical solutions in various embodiments may also be combined properly to develop other embodiments that can be understood by those skilled in the art.

The series of detailed illustration listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. An elastic heat spreader for chip packaging, comprising a top cover plate and a side cover plate that extends outward along an edge of the top cover plate, wherein the top cover plate is configured to be placed on a chip; at least a partial region of the side cover plate is an elastic member; and the elastic member at least enables the side cover plate to be telescopic in a direction perpendicular to the top cover plate; wherein the elastic member is surrounded by a flexible filling adhesive.

2. The elastic heat spreader for chip packaging according to claim 1, wherein the elastic member is inclined or perpendicular to the top cover plate.

3. The elastic heat spreader for chip packaging according to claim 2, wherein the elastic member is of a foldable structure.

4. The elastic heat spreader for chip packaging according to claim 1, wherein a partial region of the top cover plate is of a grid structure.

5. The elastic heat spreader for chip packaging according to claim 4, wherein the grid structure comprises a baffle layer disposed horizontally and a plurality of grid pieces perpendicularly disposed on upper and lower surfaces of the baffle layer; two ends of each grid piece do not exceed the top cover plate; the baffle layer and the grid pieces divide the partial region of the top cover plate into a plurality of grid grooves; and each grid groove is filled with a heat-conducting metal material which covers the grid pieces.

6. The elastic heat spreader for chip packaging according to claim 5, wherein an area of the top cover plate having the grid structure is the same as an area of the chip.

7. The elastic heat spreader for chip packaging according to claim 1, comprising a supporting portion, which is disposed at one end of the side cover plate distal from the top cover plate.

8. A packaging structure, comprising a chip carrier, a chip and the elastic heat spreader for chip packaging according to claim 1, wherein: the chip is flip-welded above the chip carrier, the heat spreader is disposed on the chip carrier and forms a cavity with the chip carrier, and the chip is disposed in the cavity; and the top cover plate is disposed on an upper surface of the chip, and the side cover plate connects the top cover plate and the chip carrier.

9. The packaging structure according to claim 8, wherein a partial region of the top cover plate is of a grid structure, and the grid structure is disposed directly above the chip.

10. The packaging structure according to claim 9, wherein a metal layer is further disposed between the top cover plate and the chip.

11. The packaging structure according to claim 10, wherein the chip carrier is a substrate, and the chip is welded to the substrate through a metal solder ball and electrically connected to the substrate.

12. The packaging structure according to claim 10, wherein the chip carrier is a redistribution layer which comprises a dielectric layer and the metal layer disposed in the dielectric layer; a photolithography pattern opening is formed in an upper surface of each dielectric layer, extends to the metal layer and exposes a surface of the metal layer; a metal electrode is disposed at the photolithography pattern opening; and the chip is welded to the metal electrode through metal posts/metal bumps, and is electrically connected to the redistribution layer.

13. The packaging structure according to claim 12, wherein the dielectric layer is a resin material having a photolithography characteristic, and the metal layer is of a single-layer or multi-layer metal structure.

14. A packaging method, comprising the following steps: providing a chip carrier; providing a chip, wherein a functional surface of the chip is flip-mounted on the chip carrier, and electrically connected to the chip carrier; and providing a heat spreader, wherein the heat spreader is disposed on the chip carrier and forms a cavity with the chip carrier; the chip is disposed in the cavity; the heat spreader is the elastic heat spreader for chip packaging according to claim 1; the top cover plate is disposed on an upper surface of the chip; and the side cover plate connects the top cover plate and the chip carrier.

15. The packaging method according to claim 14, prior to providing the heat spreader, further comprising: forming a metal layer on the upper surface of the chip.

16. The packaging method according to claim 15, wherein the step of providing the chip carrier and the step of providing the chip, the functional surface of the chip being flip-mounted on the chip carrier and electrically connected to the chip carrier, specifically comprise the following steps: providing a substrate; and welding the functional surface of the chip to the substrate through a metal solder ball so as to be electrically connected to the substrate.

17. The packaging method according to claim 15, wherein the step of providing the chip carrier and the step of providing the chip, the functional surface of the chip being flip-mounted on the chip carrier and electrically connected to the chip carrier, specifically comprise the following steps: providing a redistribution layer which comprises a dielectric layer and the metal layer disposed in the dielectric layer; forming a photolithography pattern opening in an upper surface of each dielectric layer, extending the photolithography pattern opening to the metal layer and exposing a surface of the metal layer, and disposing a metal electrode at the photolithography pattern opening; and welding the functional surface of the chip to the metal electrode on the surface of the redistribution layer through metal posts/metal bumps.

18. The packaging structure according to claim 17, wherein the dielectric layer is a resin material having a photolithography characteristic, and the metal layer is of a single-layer or multi-layer metal structure.

* * * * *